United States Patent [19]

Cronin et al.

[11] Patent Number: 5,651,857
[45] Date of Patent: Jul. 29, 1997

[54] SIDEWALL SPACER USING AN OVERHANG

[75] Inventors: John Edward Cronin, Milton; Patricia Ellen Marmillion, Colchester; Anthony Palagonia, Underhill; Bernadette Ann Pierson, South Hero; Dennis Arthur Schmidt, South Burlington, all of Vt.

[73] Assignee: International Business Machines Corporation, Armonk, N.Y.

[21] Appl. No.: 525,269

[22] Filed: Sep. 8, 1995

[51] Int. Cl.⁶ .................................................. H01L 21/3105
[52] U.S. Cl. .................... 156/644.1; 156/657.1; 156/659.11; 216/46; 437/228; 437/67
[58] Field of Search .................. 156/644.1, 659.11, 156/657.1; 216/46; 437/228, 61, 67, 41, 203, 195

[56] References Cited

U.S. PATENT DOCUMENTS

| | | | |
|---|---|---|---|
| 4,256,514 | 3/1981 | Pogge | 148/1.5 |
| 4,352,237 | 10/1982 | Widmann | 156/657.1 |
| 4,354,896 | 10/1982 | Hunter et al. | 156/657.1 |
| 4,366,613 | 1/1983 | Ogura et al. | 29/571 |
| 4,631,113 | 12/1986 | Donald | 156/657.1 |
| 4,770,897 | 9/1988 | Wu | 204/192.1 |
| 4,786,360 | 11/1988 | Cote et al. | 156/656.1 |
| 4,838,991 | 6/1989 | Cote et al. | 156/643 |
| 4,945,069 | 7/1990 | Carter | 437/67 |
| 4,965,221 | 10/1990 | Dennison et al. | 437/70 |
| 5,063,167 | 11/1991 | Shimura | 437/31 |
| 5,096,849 | 3/1992 | Beilstein, Jr. et al. | 437/228 |
| 5,241,203 | 8/1993 | Hsu et al. | 257/344 |
| 5,324,683 | 6/1994 | Fitch et al. | 437/65 |
| 5,472,890 | 12/1995 | Oda | 437/44 |

FOREIGN PATENT DOCUMENTS 0 313 814 A2  5/1989  European Pat. Off. .

OTHER PUBLICATIONS

"Micromachine Transfer Belt", Cronin et al., *IBM Technical Disclosure Bulletin*, 34, No. 4B, 330–331 (Sep. 1991).

*Primary Examiner*—R. Bruce Breneman
*Assistant Examiner*—Anita Alanko
*Attorney, Agent, or Firm*—Heslin & Rothenberg, P.C.

[57] ABSTRACT

Improved film spacers for the sidewalls within semiconductor structures are disclosed. The spacers are made of non-conformal, organic materials, such as polyimides, acrylates, methacrylates, and various photoresist compositions. They are formed on the sidewalls by a process which involves the formation of overhang structures. The film spacers may be used for a variety of applications, such as sidewall imaging, control of dopant diffusion in an FET, formation of borderless contacts, and the manufacture of a resistor from an FET.

14 Claims, 4 Drawing Sheets

SIDEWALL SPACER USING AN OVERHANG

FIELD OF THE INVENTION

This invention relates generally to a semiconductor structure, and more particularly, to spacer films for vertical surfaces within the structure.

BACKGROUND OF THE INVENTION

There appears to be an ever-increasing demand for higher levels of integration in semiconductor circuits. In order to increase the density of devices within the semiconductor structures, some of the devices have been emplaced within the depths of the substrate, in addition to being formed on its planar upper surface.

Dynamic random access memories, or "DRAM's", typically employ openings or "trenches" for memory cell capacitance. The trenches are also used to isolate individual devices within a monolithic circuit. In order to further increase the densities of these circuits, technologists have begun to form semiconductor structures within the trenches themselves, i.e., on top of or within an interior ("concave") surface of the trench. (This area of technology is thus sometimes referred to as three-dimensional or "3D" semiconductor processing.) The formation of semiconductor structures on these interior surfaces has been very difficult, since standard photolithographic techniques are not always well-suited in this situation.

A method for enhancing photolithographic capabilities for producing images on the sidewalls of trenches is described in U.S. Pat. No. 4,838,991, issued to Cote et al. A technique described in that patent involves the formation of sidewall spacers, which are very useful structural features. As an example, spacers may serve as masks for a variety of devices which can be formed in the sidewalls, e.g., field effect transistors (FETs). Spacers can also serve to control the lateral migration of an implanted dopant under the gate of an FET. The formation of spacers within a silicon body is also taught by Pogge in U.S. Pat. No. 4,256,514. Furthermore, U.S. Pat. No. 5,096,849, issued to Beilstein, Jr. et al., describes a method for selectively masking portions of the sidewall of a trench or other concave structure by forming spacers or "bands" on the sidewalls.

It's thus apparent that spacers can play an important part in the formation of devices within the surfaces of a trench or opening in a semiconductor substrate. However, there are some serious limitations to current spacer technology. For example, the final spacer film has had to be conformal, i.e., conforming to the underlying surface. The conformal materials currently used for spacers are usually oxides or nitrides which are applied by various chemical vapor deposition (CVD) techniques. Most of the conformal materials are inorganic, although an organic material, poly-p-xylylene or "parylene", is also a conformal material. The inorganic conformal materials can be difficult to etch, thus increasing processing time and complexity.

The use of non-conformal materials as spacers does not appear to be known in the art. Unfortunately, this excludes a wide variety of organic materials from consideration as spacers, e.g., organic polymers like polyimides and photoresist resins. Organic, non-conformal materials would appear to have several notable advantages over the inorganic, conformal materials currently used for spacers. For example, the organic materials could be very easily applied and patterned, using standard photolithographic techniques, such as shadow projection masks. Furthermore, organic, non-conformal spacers could be selectively removed from the inner surfaces of a trench much more easily than inorganic materials.

Reference to the Beilstein patent mentioned above is helpful in pointing to some of the difficulties involved in the formation of inorganic, conformal spacers. Beilstein describes a method for selectively masking sidewall regions of a trench formed in a semiconductor body. A conformal layer of masking material is first formed on the trench surfaces, followed by the deposition of a selectively removable material (e.g., a photoresist material) to fill the trench. Reactive ion etching of the trench-filling material to a predetermined depth d1 determines where the bottom edge of the sidewall spacer will be placed. A conformal layer of an organic material such as parylene is then deposited to cover all of the vertical and horizontal surfaces. Another reactive ion etch then removes the horizontal portions of the conformal coating, leaving sidewall portions of the coating which adhere to the sidewalls of the trench. Then, an additional layer of a photoresist-type material is deposited on the exposed surfaces of the substrate and trench. This additional layer of material and the conformal coatings previously applied are etched by RIE to a second depth d2, which will determine the top edge of the spacer. Both of the photoresist-type materials which remain can then be removed, leaving the conformal coating regions on the sidewalls, over the initial film which had been applied. A selective etch procedure can then be used to remove uncovered areas of the first coating, but not the conformal, masking layer. After removal of the masking layer, the underlying regions of the first coating are left as sidewall spacers, as depicted in the figures of the patent.

While the Beilstein technique is effective for the creation of sidewall spacers under some circumstances, it is a rather complicated process involving many steps. Furthermore, the process sometimes cannot create a spacer of very precise dimensions. For example, the depth "d1" mentioned above determines the lower boundary of the spacer. However, the reactive ion etching step used to etch the photoresist-type material to this depth may result in a depth variance of as much as +or −20%. This variation from trench-to-trench can hinder the reproduction of exact images on the sidewalls of trenches.

New methods for forming and using sidewall spacers would thus represent a welcome advance in the art of preparing high density semiconductor structures. Moreover, new materials for use as spacers would also be very desirable in the art, so that processing is not excessively dependent on the use of conformal, inorganic materials which sometimes exhibit the disadvantages discussed above. Finally, applications for employing the spacers of the present invention would also be of great interest in the formation of various semiconductor structures.

SUMMARY OF THE INVENTION

The present invention is directed to some of the concepts described above. In one aspect, it involves a method for forming a non-conformal film spacer on the sidewall of a trench within a semiconductor structure, comprising the steps of:

(a) forming at least one overhang on the uppermost edge of the sidewall surface, said overhang protruding laterally from the sidewall surface over a portion of the bottom surface of the trench;

(b) applying a removable film of non-conformal material to the trench; and then (c) removing the portion of the non-conformal material which does not lie underneath the overhang, so that a film spacer of the non-conformal material remains only underneath the overhang.

The non-conformal film spacer is preferably an organic material such as a photoresist composition, a polyimide, an acrylate material, or a methacrylate material.

Various techniques for forming the overhang structure represent additional aspects of this invention. Furthermore, applications for using the film spacers are also part of the invention. For example, the spacers may be used in sidewall-imaging processes; and in the control of dopant diffusion in an FET. They may also be employed in the formation of borderless contacts, and in the manufacture of a resistor from an FET. All of these applications will be discussed in the description which follows.

DETAILED DESCRIPTION OF THE INVENTION

As described previously, film spacers according to this invention may be formed within practically any opening on any part of a semiconductor structure. Thus, the term "trench" as used herein is meant to embrace any of the vias or cavities which are typically formed during semiconductor processing. The opening may be in the semiconductor substrate, or in any layer or set of layers above the substrate, e.g., an opening in an oxide or nitride layer. The "sidewall" as used herein refers to the substantially vertical wall abutting the bottom of the trench or opening. "Substantially vertical" as used herein refers to sidewalls which are less than about 20° from the theoretical vertical, based on reference to a substantially horizontal substrate. Usually, the sidewalls are less than about 10° from the theoretical vertical. Although this invention may be directed to the formation of a spacer on one sidewall, it is understood that more commonly, the invention is utilized for the formation of film spacers on the two sidewalls of a trench.

Figure 1:
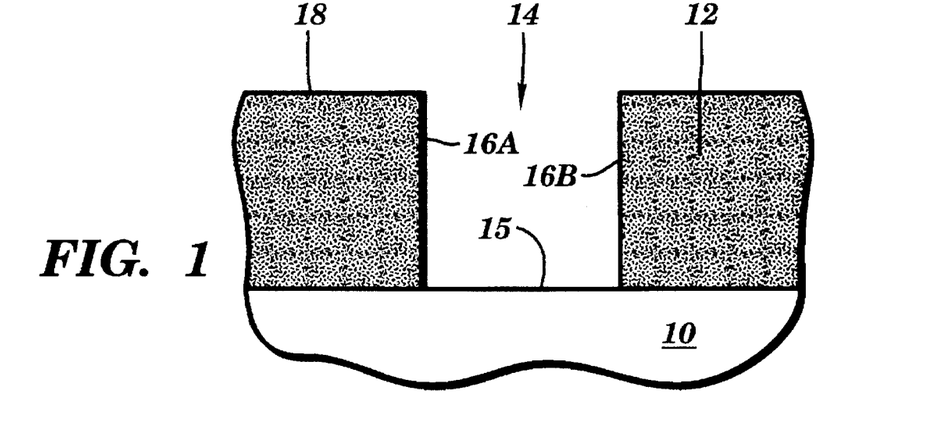
FIGS. 1–6 represent cross-sectional views of one embodiment for the preparation of sidewall spacers in a semiconductor structure, based on the present invention.

In the exemplary embodiment beginning with FIG. 1, a trench 14 has been formed within insulating layer 12 (e.g., an oxide layer) by conventional techniques. The insulating layer is disposed over substrate 10, which may be a polysilicon wafer, for example. The sidewalls 16A, 16B of the trench are also the side edge surfaces of the insulating layer, which itself may be formed of a material like silicon dioxide. The bottom surface 15 of trench 14 is also a portion of the upper surface of substrate 10. As mentioned previously, spacer films can be formed for a variety of functions, e.g., to reserve a space in the trench for later processing; to serve as a mask; or to control the lateral diffusion of dopant atoms below the gate region of an FET device situated adjacent to the spacer. Thus, the particular size and shape of the spacer will be determined by its intended function. One of the attributes of this invention is its capability of easily and accurately influencing the shape of the spacer film, as described further on in this disclosure. (The spacer films are sometimes referred to herein as "spacers" or "film spacers".)

Overhang structures are utilized in this invention to form the spacer films. The overhangs will eventually serve as spacer masks during an etching step, and the spacer films will be formed underneath the masks, as described in greater detail below.

Figure 2:
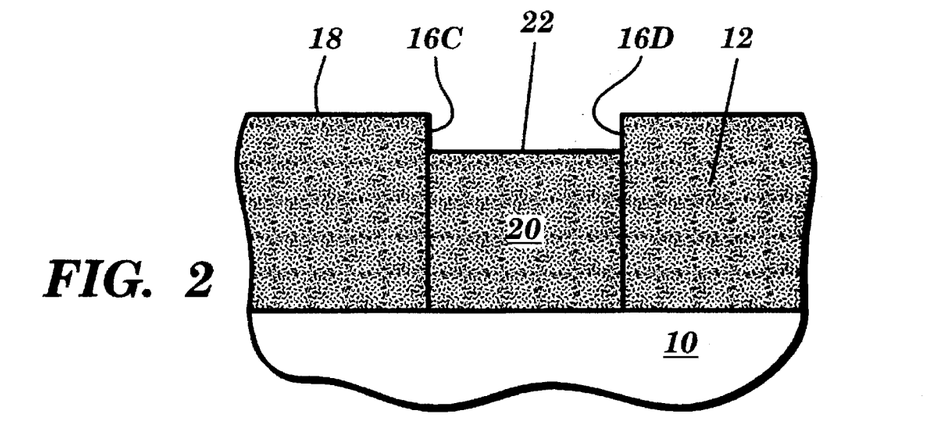

There are a variety of techniques for forming an overhang on the uppermost edge of a sidewall surface like that of 16A in FIG. 1. One technique for forming the overhang is depicted in FIG. 2, in which trench 14 (sometimes referred to herein as the "major trench") has been filled with a layer of removable material 20 which has been planarized and then etched back to some distance below the planarized surface 18 of the insulating layer, forming "minor trench" 14A (referenced in FIG. 3). Reactive ion etching is usually used in this step, but other known techniques may also be used to remove the desired portion of layer 20.

The composition of removable material 20 is not critical to the present invention. It is usually in the form of a mandrel, i.e., a block of material typically having substantially vertical sidewalls. The mandrel can be formed of a variety of materials, e.g., organic resinous materials like polyimide; photosensitive polymers like photoresists; or various nitrides or oxides, e.g., silicon nitride.

The amount of material 20 which is removed from the trench is determined in part by the desired size of the spacer masks which will eventually be formed on portions of layer surface 22, as described below. In general, enough of layer 20 will be removed so that the height ratio of upper sidewall section 16C to the entire sidewall 16A will be in the range of about 1:3 to about 1:10. The same ratio range holds true for 16D and 16B.

Figure 3:
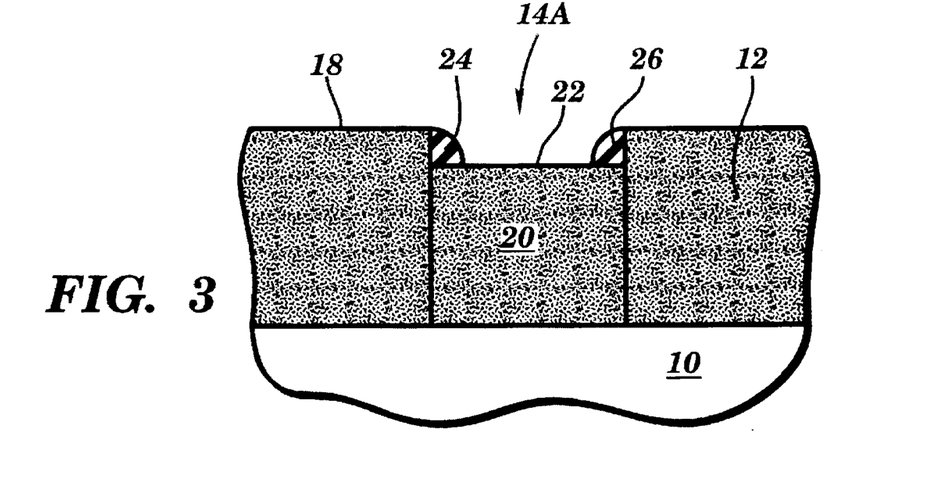

As depicted in FIG. 3, spacer masks 24 and 26 are then formed on the top of a portion of layer 20, i.e., at the corner of sidewall sections 16C and 16D with layer surface 22, respectively. (It should be emphasized that only one of the spacer masks is necessary if only one spacer film is to be formed. This embodiment illustrates a situation in which a spacer film is being formed on each of the trench sidewalls 16A and 16B.) The height of the spacer mask is determined by the height of sidewall sections 16C and 16D, i.e., the depth of minor trench 14A. The width of the spacer masks, i.e., the length to which they each protrude toward the center of layer surface 22, is determined by the approximate thickness desired for the film spacer as described herein and depicted in the figures which follow. The width should usually be less than the height of the spacer mask.

Techniques for forming spacer masks 24 and 26 are well-known in technical arts related to standard spacer processes. For example, a uniform layer of a spacer material could be applied over all of surface 22 and surface 18, filling minor trench 14A. All of the horizontally-disposed regions of the spacer layer material could then be directionally etched (e.g., by RIE), leaving portions 24 and 26, which serve as the spacer masks. The formation of spacer masks is also generally described in U.S. Pat. Nos. 5,096,849; 4,945,069; and 4,256,514, all incorporated herein by reference.

Choice of an appropriate spacer mask material depends in part on the composition of the materials forming layers 12 and 20, as well as the composition of the material forming the film spacer itself, which will be described below. In general, any material which can be conformally deposited and can be used as an etch mask for the film spacer is suitable. The material must also be one which is not affected when material 20 (e.g., the mandrel) is removed. Exemplary materials for the spacer masks are polysilicon, nitrides and oxides. The spacer mask material should be different from that of removable material 20, for etching efficiency. Thus, if the spacer mask is made of an oxide, material 20 could be nitride, for example.

Figure 4:
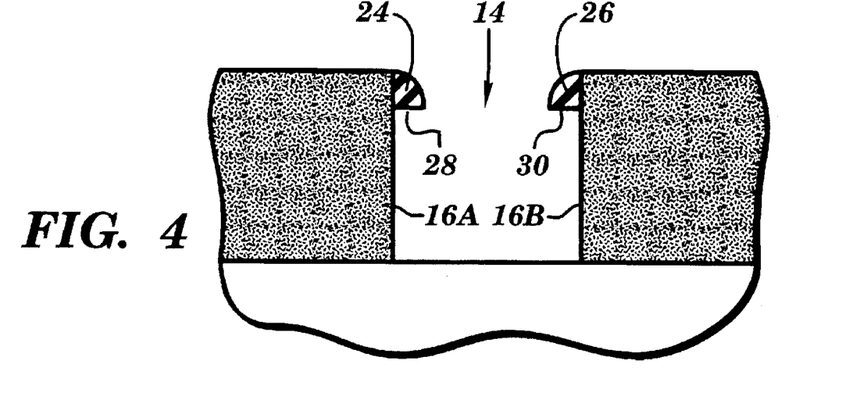

As shown in FIG. 4, layer 20 is then removed completely, re-opening trench 14. Removal of the layer 20 material can be carried out by various means, e.g., isotropic (non-directional) etching of the material by conventional techniques, e.g., wet-etching. After removal of layer 20, only spacer masks 24 and 26 remain, and they can now be appropriately referred to as "overhangs" having lower surfaces 28 and 30, respectively, as depicted in the figure.

Figure 5:
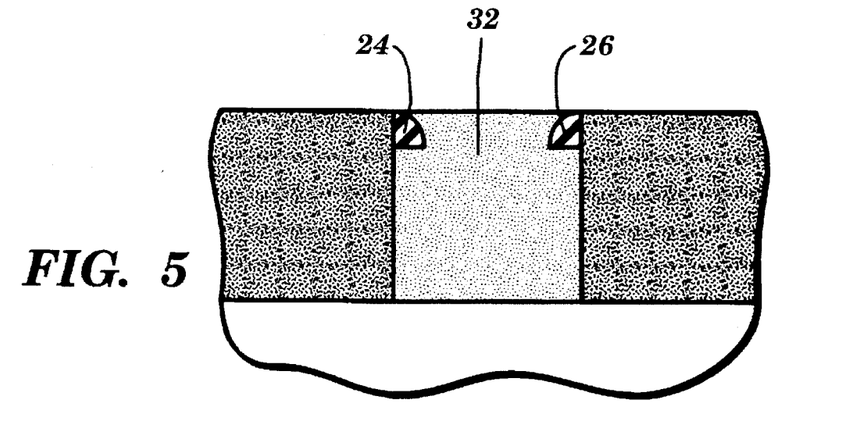

In some preferred embodiments, trench 14 is then filled, by conventional techniques, with a material 32 suitable for use as a film spacer according to the present invention. FIG. 5 is illustrative. The film spacer material should be one that is non-conformal; it also usually covers overhangs 24 and 26. (As described below, other embodiments do not require that the trench be completely filled.)

"Non-conformal" as used herein defines a material which does not simply conform to the underlying surface of a trench, but instead fills the entire volume of the trench, after the material is deposited and allowed to settle. A wide variety of organic monomeric and polymeric materials are non-conformal.

One common class of non-conformal materials are photoresist compositions. These compositions are well-known in the art, and described, for example, in *Introduction to Microlithography*, ACS Symposium Series 219, American Chemical Society, 1983. Photoresists are also described in U.S. Pat. No. 4,838,991 (mentioned previously) and U.S. Pat. No. 5,362,599, incorporated herein by reference. An example of a two-component, positive photoresist composition comprises a phenolic resin matrix material and a sensitizer, e.g., diazonaphthoquinone. Shipley's "Microposit" materials are exemplary. Various acrylate and methacrylate compounds are also used as photoresists. For example, poly(methyl methacrylate) is a typical one-component, positive photoresist.

One- and two-component materials used as negative resists are also suitable for the film spacer, e.g., materials based on a cyclized synthetic rubber matrix, often combined with a bis-arylazide sensitizer, such as Eastman Kodak's "KTFR" products. Moreover, those skilled in the art can readily choose from other classes of resist materials, such as epoxies, novolacs, and styrene resins. Various copolymer materials may also be used, like Bell Laboratories "COP", which is a copolymer of glycidyl methacrylate and ethyl acrylate.

Polyimides may also be used as the spacer film material. In fact, any organic material capable of being deposited in completely filling trench 14 should be suitable for this step of the present invention. In preferred embodiments, the spacer film material should be one that does not have to be cured thermally. In other words, the material should be curable by ultraviolet radiation (UV), X-ray exposure, or electron beam exposure. In some especially preferred embodiments, UV-cured photoresist compositions are preferred for the spacer material.

Figure 6:
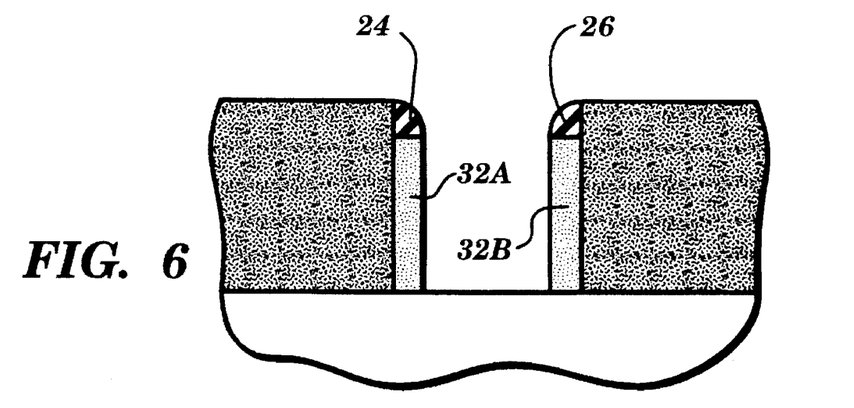

As depicted in FIG. 6, the spacer film material is then removed from all portions of the trench, except for the regions which are substantially aligned underneath each of the overhangs 24 and 26. Several techniques exist for removing the spacer film material. Usually, anisotropic etching is quite sufficient, i.e., directionally etching using RIE. The resulting structure thereby includes film spacers 32A and 32B, which can perform a variety of functions in semiconductor processing, as described herein.

Since the film spacer material is usually applied in a blanket deposition, it typically fills the trench and covers the overhangs which protrude from the trench sidewall. However, it is not necessary to completely fill the trench, or to cover the overhangs. With reference to FIG. 6, for example, film spacers 32A and 32B could be formed in the manner described above, even if material 32 initially only rose to the level of the lower surfaces 28 and 30 of spacer masks 24 and 26, respectively.

Moreover, shorter film spacers could be formed by filling less of the trench with spacer material 32. In other words, a technique like anistropic etching would still accomplish the same objective, even if there is space between layer 32 and the lower surfaces of the spacer masks. The height of the film spacer would of course be determined by the vertical depth of material 32.

Figure 7:
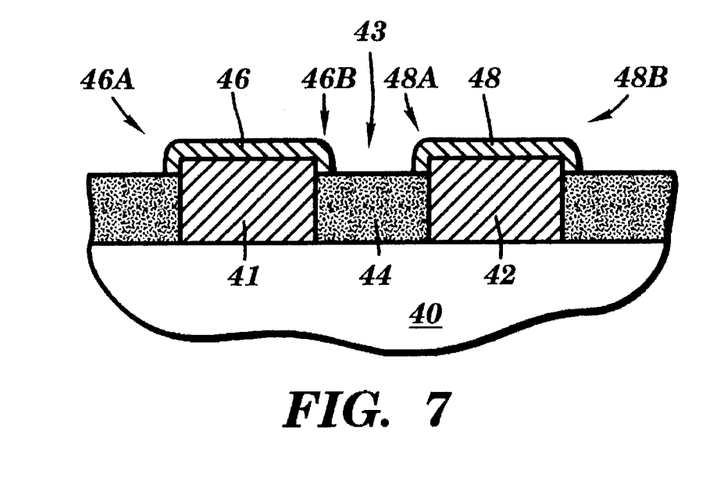
FIGS. 7 and 8 are cross-sectional views depicting an alternative method for preparing overhang structures prior to the formation of sidewall spacers, according to the present invention.

Another aspect of the present invention is directed to other techniques of forming the overhang structures which are utilized in the preparation of the film spacers. As an example, FIG. 7 depicts the first stage of a technique for forming at least one overhang in trench 43, utilizing a material which selectively deposits on the material of the structure surrounding the trench. As an example, studs 41 and 42, which may be formed of a refractory metal like tungsten, could be formed on the surface of substrate 40, with a trench 43 being situated between the studs (in FIG. 7, trench 43 is partially filled, as described below). The layer 44 of removable film was initially deposited to fill trench 43, followed by planarization of the layer so that it was coplanar with the top surface of the studs. This portion of the embodiment is similar to that described previously, e.g., as depicted in FIGS. 2–3. Layer 44 may be formed of the same materials used previously, e.g., oxide, nitride, and the like. A portion of the planarized layer is then removed to decrease its thickness and form a minor trench within the structure, i.e., the depressed region between studs 41 and 42.

A second layer of film is then deposited. This film layer material is selective to deposition on the material forming the studs. For example, if the studs are formed of tungsten, the second film layer is some form of selective tungsten, deposited by well-known techniques. Deposition of the second material takes place on all of the exposed vertical and horizontal surfaces of the studs, in effect forming caps 46 and 48 on top of studs 41 and 42 respectively, as depicted in FIG. 7. As should be evident, the outlying portions of each stud, i.e., 46A, 46B and 48A, 48B will serve as overhangs during formation of the film spacers. The dimensions of these portions will generally be within the guidelines described in the earlier embodiment.

Figure 8:
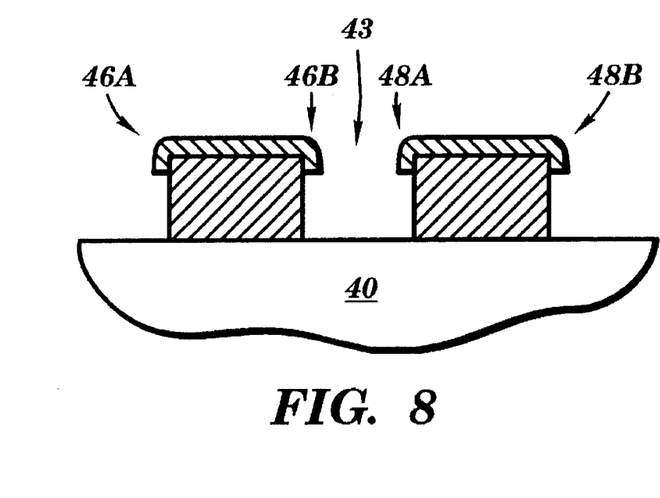

In the next step, all of layer 44 is removed by a suitable technique, such as isotropic etching, leaving the overhangs, as shown in FIG. 8. The remainder of the process for film spacer formation can be carried out as described for the first embodiment, and need not be described in great detail here. In other words, uncovered trench 43 can now be filled with a suitable non-conformal material, e.g., an organic photoresist composition, followed by removal of the unwanted portions of this film spacer material by directional etching, which will leave the remaining, aligned material under overhangs 46B and 48A as film spacers. The same general process could be used to form film spacers on the outer edges of each stud, i.e., under overhangs 46A and 48B, if these outer edges of the studs happen to be the sidewalls of additional, separate trenches.

Furthermore, this particular technique for forming an overhang could be used with any structure in which a cap of material can be selectively deposited on the top surface of a stud or other element formed of a material appropriate to such selective deposition. For example, single crystal silicon or selective tungsten could be deposited on silicon; selective copper could be deposited on copper or tungsten; and selective silicon could be deposited on tungsten. Suitable deposition techniques are known, e.g., electroless plating.

Figure 9:
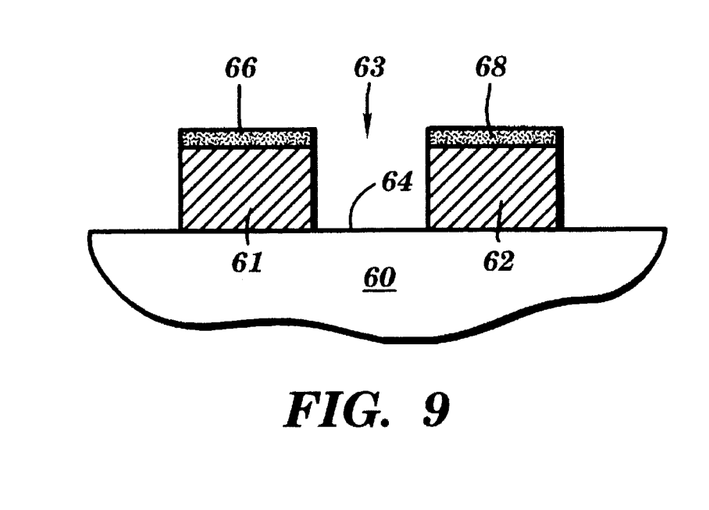
FIGS. 9 and 10 are also cross-sectional views, depicting another method for creating overhang structures for film spacers according to the present invention.

Still other techniques in line with the present invention are available to form overhang structures useful for the above-described process. For example, studs or other pedestals, like elements 61 and 62 in FIG. 9, could be formed of an etchable material like polysilicon, situated on any type of substrate 60. Trench 63 is situated between the inner sidewalls of the studs. Cap layers 66 and 68 have been formed to completely cover the top surfaces of each of the studs. The cap layers can be put into place by conventional patterning and etching steps, and they are preferably formed of a material which will not be affected by the etching of the material forming studs 61 and 62. For example, if the studs are formed of polysilicon, cap layers 66 and 68 can advantageously be formed of a material which is not etched during the etching of the polysilicon, e.g., a material such as nitride. The thickness of the cap layer is not critical to this invention, and will depend on the thickness desired for the overhangs described below. In general, the ratios for similar structure thicknesses provided above will serve as sufficient guidance for those of ordinary skill in the art.

Figure 10:
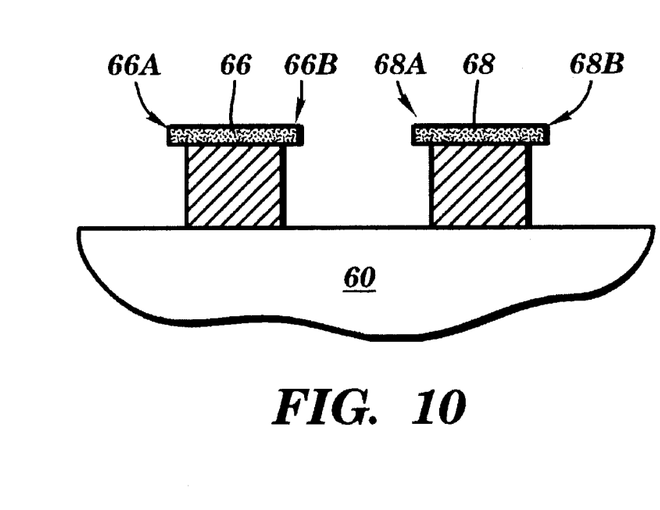

As shown in FIG. 10, a portion of the exposed surfaces of the studs is removed. For a material such as polysilicon, wet-etching is advantageously used to remove enough of the sidewalls of the stud to form overhangs 66A and 66B of sufficient dimensions. The wet-etching process used will not affect a cap layer material like nitride.

Other combinations of stud and cap layer materials could be used. For example, if the studs were formed of a material like polysilicon, the cap layer could be formed of a material like silicon nitride. Other possible combinations of stud material/cap material for this embodiment include oxide/nitride; nitride/oxide; polyimide/nitride; polyimide/oxide; and metal/nitride (wherein the metal can be tungsten or aluminum, for example). Moreover, if the cap layer were to be a metal, then the material forming the stud could be any insulating material. Efficient techniques for the removal of a sufficient amount of the stud layer material for each of these examples are well-known. Regardless of the particular materials used, the resulting overhang structures are then used to form film spacers, as described previously.

Figure 11:
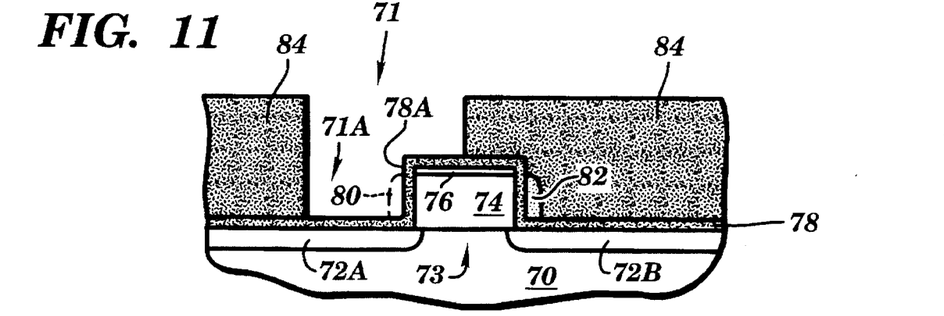
FIG. 11 is a cross-sectional view of a semiconductor structure in which a film-spacer is removed during the formation of borderless contacts.

The non-conformal film spacers described herein may be used in a variety of applications which represent additional aspects of this invention. One exemplary application is shown in FIG. 11, which depicts a field effect transistor (FET) device formed on a substrate 70 (which itself should be viewed as representative of any type of substrate, e.g., oxide or polysilicon). The FET includes well-known features, i.e., gate 74, channel 73, source and drain regions 72A, 72B, cap layer 76 (e.g., a nitride layer), and dielectric layer 78 (often formed of nitride), which covers the entire device. Spacers 80 and 82 are commonly formed on the sidewalls of the FET to control migration of dopant ions during dopant implantation to form the source and drain regions.

This FET could be part of a highly-integrated circuit. In order to increase the density of the structure, studs are partially emplaced over the FET gate itself, in what is sometimes called a "borderless contact" arrangement. As an example, the trench or via 71 in FIG. 11 could eventually be filled with a conductive material like tungsten or an alloy thereof, to form a stud (not shown), which could connect an active region of the FET like source/drain 72A to some other active region of the circuit, e.g., a global interconnection layer of metal disposed at some level over the top of the stud.

Since spacer 80 has already performed its function during dopant implantation, it is no longer needed in subsequent interconnection steps. If it remains, it takes up valuable space, e.g., that needed for connection of the stud to source/drain 72A. However, removal of conventional, inorganic spacers in this situation can be very difficult. Etching steps needed for such removal can damage the FET gate.

Thus, use of the non-conformal, organic spacer films of the present invention, formed as described above, can be very advantageous. The shape and thickness of this type of spacer film (cured by UV light or a similar technique) can be very precisely controlled to conform to the particular requirements of dopant diffusion. Moreover, organic spacer films can be very easily removed by conventional techniques, e.g., etching with a solvent which does not affect the sidewall of the gate. As an example, an organic spacer film formed of a photoresist material could readily be removed by treatment with a developer solution. Alternatively, the spacer film could be removed by a plasma technique, e.g., $O_2$ plasma.

Furthermore, some of the spacer films of this invention, such as the photoresist compositions, are highly "imageable", i.e., capable of being imaged. This is in contrast to inorganic spacers, or to conformally applied parylene, since those materials are generally not imageable.

There are other important uses for the non-conformal, organic spacer films of the present invention. One exemplary application involves the preparation of a device (such as an FET) having a lightly doped drain ("LDD"). The LDD regions can sometimes provide important advantages in the operation of a device. For example, they allow the high electric field at the drain pinchoff region to be spread, resulting in an increase in the device channel breakdown voltage, as described in U.S. Pat. No. 4,366,613, issued to S. Ogura et al, and incorporated herein by reference. The concept of LDD is also described in U.S. Pat. Nos. 5,369,049 and 5,241,203, issued to Acocella et al and Hsu et al, respectively, and incorporated herein by reference, as well as in *VLSI Technology*, S. M. Sze, 2nd edition, McGraw-Hill, 1988.

Figure 12:
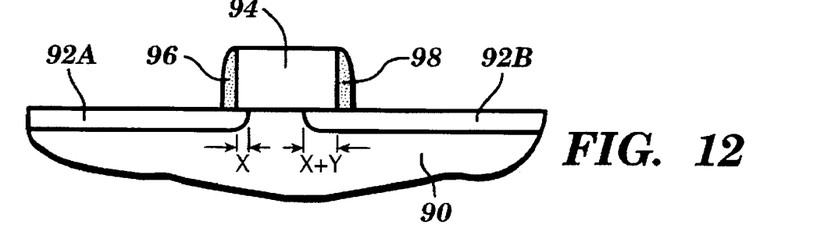
FIG. 12 is a simplified, cross-sectional view depicting the use of film spacers to control the lateral migration of dopant atoms under the gate of an FET-type device.

Precise control of dopant distribution is required in the formation of an LDD, and the use of spacers which are easily removable can ensure such control. FIG. 12 depicts, in simplified form, a portion of an FET-type device formed on substrate 90. The device includes gate 94 and source/drain regions 92A and 92B. Spacers 96 and 98 perform the function described above, i.e., control of the lateral diffusion of dopant atoms under the gate, to form the desired dimension of each source/drain region. Several techniques exist for varying the distribution and lateral migration between each region. For example, an initial dopant implantation could be carried out by conventional techniques, through both of the spacers 96 and 98. The dopant atoms would typically migrate by out-diffusion to a distance of dimension "X", as shown in the figure. Under the assumption that 92A will be the LDD region, spacer 98 is then removed, exposing the underlying region over source region 92B. Since spacer 98 is formed from an organic material according to the present invention, removal (as described above) is easy and precise, without adversely affecting the gate.

An additional dopant implant and subsequent out-diffusion will result in further migration of dopant atoms in the region not protected by a spacer, i.e., source 92B. The additional length of lateral diffusion is designated as dimension "X+Y" in FIG. 12. Lateral diffusion under drain region 92A remains substantially at dimension "X", as required for the LDD device. Spacer 96 can then be removed if desired, and the remaining features of the device can be formed in typical fashion, e.g., insulating layers, studs, connection to global metallization layers, and the like.

Still another application for film spacers based on the present invention involves the preparation of certain semiconductor devices by the use of double spacers. As an example, it is known that a resistor can be made from an FET by connecting the gate to the drain region by, for example, applying appropriate metallization to create an electrical short between those two elements of the device. At the present time, connection is usually made by etching an appropriate contact via and then connecting the gate and the drain by a wire. However, this technique requires a substantial amount of space near the gate region.

Figure 13:
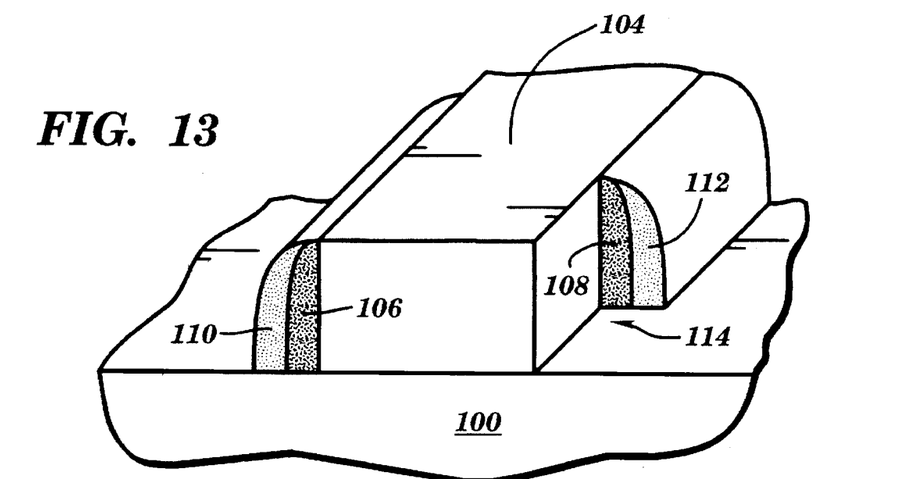
FIG. 13 is another simplified view, depicting the use of films spacers during conversion of an FET device to a resistor.

An alternative technique for connecting the gate to the drain region is depicted in FIG. 13, which is a simplified view of a portion of an FET, formed on substrate 100. Gate 104 is depicted, but the underlying source/drain regions have been omitted for the purpose of simplicity. Conventional, inorganic spacers (usually made of an oxide- or nitride-type material) 106 and 108 are formed on the vertical sidewalls of the gate, or on a dielectric layer (not shown) which may have been formed on the gate sidewalls. Non-conformal, organic spacers 110 and 112, based on the present invention, have in turn been formed on the substantially vertical surfaces of the inorganic spacers, as shown in the figure. As described above, the organic spacers can be formed easily and precisely, using photosensitive polymers, for example. They can also be readily patterned and etched without adversely affecting either the gate or the inorganic spacers.

In this embodiment, at least one of the organic spacers, which is preferably a photoresist material that can be exposed and developed by light, e.g., UV light, is used as mask for the patterning and etching of the underlying inorganic spacer. In other words, the inorganic spacer would be removed only where the organic spacer film was opened, by etching, for example. In cutaway fashion, FIG. 13 depicts an area 114 where the inorganic spacer 108 has been etched, based on a designed pattern formed in organic film spacer 112. A standard metallization technique can then be employed (e.g., selective metallization) to grow metal on the exposed gate surface and purposefully short it to an underlying diffusion region, forming the desired resistor.

Figure 14:
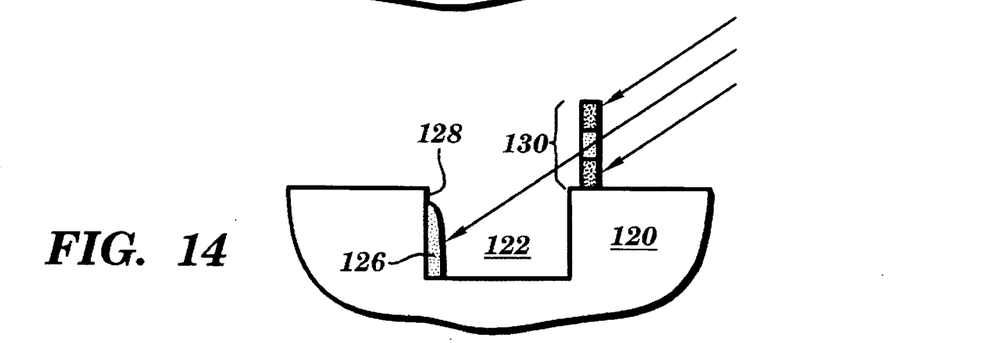
FIG. 14 is a cross-sectional view of a semiconductor structure, depicting the use of a film spacer to form sidewall images, utilizing a vertical structure on top of the semiconductor surface.

The film spacers of the present invention are also very useful in the implementation of new methods for defining masking regions on the wall of a semiconductor structure. For example, pending patent application Ser. No. 08/485, 292 (Docket No. BU9-95-038), filed on Jun. 7, 1995 and assigned to the assignee of the present invention, describes a novel method for defining a mask region on a trench wall. (Ser. No. 08/485,292 is incorporated herein by reference.) FIG. 14 in the present application depicts one embodiment of that method, in which trench 122 has been formed within substrate 120, which itself may represent a variety of features in a semiconductor structure. A vertical structure 130 has been disposed on top of the substrate, spaced from and extending parallel to sidewall 128. The vertical structure includes an area of transparency, reflection, or refraction. Spacer film 126 has been precisely formed on the sidewall in the manner described previously. In this embodiment, the organic spacer film is preferably a light-sensitive material, such as a high contrast photoresist.

Light projected at a given angle passes the vertical structure via the area of transparency/reflection/refraction to impinge upon the sidewall and define the desired region. As further described in Ser. No. 08/485,292, the vertical structure could comprise various segments for the blocking, transmission, or reflection of light, again depending on the desired pattern for the sidewall image. Moreover, the structure could be in various shapes, e.g., the shape of a prism.

In fact, as mentioned above, the photoresist-type film spacers of this invention are capable of being easily imaged into a wide variety of patterns on semiconductor sidewalls—those described in the above-referenced Beilstein patent, as well as patterns which are much more intricate. These patterns in turn allow formation of a variety of circuit elements within the sidewalls.

Many changes will become apparent to those skilled in the art. Therefore, the embodiments disclosed herein are illustrative, rather than limiting.

All of the above-mentioned patents, patent applications, and other references are incorporated herein by reference.

We claim:

1. A method for forming a non-conformal film spacer on the sidewall of a trench within a semiconductor structure, comprising the steps of:

(a) providing a semiconductor structure having the trench therein;

(b) forming at least one overhang on the uppermost edge of the sidewall surface, said overhang protruding laterally from the sidewall surface over a portion of the bottom surface of the trench;

(c) applying a removable film of non-conformal material to the trench; and then (d) removing the portion of the non-conformal material which does not lie underneath the overhang, so that a film spacer of the non-conformal material remains only underneath the overhang.

2. The method of claim 1, wherein the overhang is formed by:

(i) depositing a layer of etchable film to fill the trench, and planarizing the layer so that it is coplanar with the surface of the semiconductor structure;

(ii) removing a portion of the upper region of the etchable film layer, to uniformly decrease the thickness of the layer and form a minor trench within the structure, wherein the bottom of the minor trench is the top surface of the layer of etchable film;

(iii) forming a spacer mask protruding from the corner formed by the minor trench bottom and the abutting portion of the sidewall, said spacer mask having a shape selected for the shape of the overhang; and (iv) isotropically etching all of the remaining etchable film layer, including the area under the spacer mask, so that the spacer mask becomes an overhang within the uncovered trench.

3. The method of claim 2, wherein the trench is within an insulating layer deposited on a semiconductor substrate.

4. The method of claim 2, wherein two overhangs are formed, each on a facing sidewall.

5. The method of claim 1, wherein the sidewall is the vertical surface of a conductive element; and the overhang is formed by:

(i) depositing a layer of etchable film to fill the trench, and planarizing the layer so that it is coplanar with the surface of the semiconductor structure;

(ii) removing a portion of the upper region of the etchable film layer, to uniformly decrease the thickness of the layer and form a minor trench within the structure, wherein the bottom of the minor trench is the top surface of the layer of etchable film;

(iii) depositing a second film layer, which is selective to deposition on the material forming the conductive element, said second film layer thereby covering all exposed vertical and horizontal surfaces of the conductive element, wherein the second film layer covering the exposed vertical surfaces of the conductive element functions as a spacer mask; and then (iv) isotropically etching all of the remaining etchable film layer, including the area under the spacer mask, so that the spacer mask becomes an overhang within the uncovered trench.

6. The method of claim 5, wherein the trench is situated between two conductive elements.

7. The method of claim 5, wherein two overhangs are formed, each on a facing sidewall.

8. The method of claim 5, wherein the conductive element is formed of tungsten or a tungsten alloy; and the second film layer comprises selective tungsten.

9. The method of claim 1, wherein the sidewall is the vertical surface of a polysilicon or oxide element which also has an upper horizontal surface; and the overhang is formed by:

(i) covering the upper horizontal surface of the polysilicon or oxide element with a cap layer; and then (ii) removing a substantially uniform, vertical portion of the polysilicon or oxide element from under the cap layer, so that the region of the cap layer which no longer covers underlying polysilicon or oxide material becomes an overhang within the trench.

10. The method of claim 9, wherein the cap layer is a nitride material, and wherein step (ii) is carried out by wet-etching.

11. The method of claim 1, wherein the non-conformal material is an organic material.

12. The method of claim 11, wherein the organic material is a photoresist composition.

13. The method of claim 11, wherein the organic material is selected from the group consisting of polyimides, acrylates, methacrylates, epoxies, novolacs, styrene resins; mixtures of any of the foregoing; and copolymers of any of the foregoing.

14. The method of claim 11, wherein the organic material comprises a phenolic resin and a sensitizer.

* * * * *